United States Patent [19]

Laukien et al.

[11] Patent Number: 5,168,211

[45] Date of Patent: Dec. 1, 1992

[54] MAGNET SYSTEM

[75] Inventors: Günther Laukien, Rheinstetten; Michael Westphal, Offenbach, both of Fed. Rep. of Germany

[73] Assignee: Bruker Analytische Messtechnik GmbH, Fed. Rep. of Germany

[21] Appl. No.: 761,736

[22] PCT Filed: Mar. 8, 1990

[86] PCT No.: PCT/DE90/00171

§ 371 Date: Sep. 11, 1991

§ 102(e) Date: Sep. 11, 1991

[87] PCT Pub. No.: WO90/10877

PCT Pub. Date: Sep. 20, 1990

[30] Foreign Application Priority Data

Mar. 11, 1989 [DE] Fed. Rep. of Germany ..... 39073927

[51] Int. Cl.$^5$ ............................. G01V 3/00; H01F 7/20
[52] U.S. Cl. ..................... 324/319; 324/320; 335/299
[58] Field of Search ............... 324/318, 319, 320, 322; 335/296, 299, 300

[56] References Cited

U.S. PATENT DOCUMENTS

| | | | |
|---|---|---|---|
| 4,398,150 | 8/1983 | Barjhoux et al. | 324/319 |
| 4,689,591 | 8/1987 | McDougall | 335/299 |
| 4,701,736 | 10/1987 | McDougall | 335/299 |
| 4,710,741 | 12/1987 | McGinley | 335/299 |
| 4,721,914 | 1/1988 | Fukushima | 324/320 |
| 4,890,082 | 12/1989 | Fujita | 324/320 |

FOREIGN PATENT DOCUMENTS

| | | |
|---|---|---|
| 0111219 | 6/1984 | European Pat. Off. |
| 0160350 | 11/1985 | European Pat. Off. |
| 0187389 | 7/1986 | European Pat. Off. |
| 0314262 | 5/1989 | European Pat. Off. |
| 3123493 | 12/1982 | Fed. Rep. of Germany |
| 3333755 | 4/1985 | Fed. Rep. of Germany |
| 2158248 | 11/1985 | United Kingdom |

OTHER PUBLICATIONS

Review of Scientif Instruments, vol. 52, No. 10, Oct. 1981, American Institute of Physics, (New York, U.S.), pp. 1501-1508.
H. Saint-Jalmes et al.: "Optimization of Homogeneous Electromagnetic Coil Systems: Application to Whole-Body NMR Imaging Magnets".
Review of Scientific Instruments, vol. 56, No. 3, Mar. 1985, American Institute of Physics, (New York, U.S.), pp. 402-410.
A. R. Rath et al.: "Opposed Coil Magnet Calculations for Large Sample and Unilateral Nuclear-Magnetic-Resonance".

Primary Examiner—Louis Arana
Attorney, Agent, or Firm—Walter A. Hackler

[57] ABSTRACT

A magnet system to generate a static, uniform magnetic field in the examination chamber of a nuclear spin tomograph has a pair of outer field coils (1a, 1b) arranged on a common axis (a) at a mutual axial distance ($g_1$) and a pair of inner field coils (2a, 2b) coaxial with the outer ones which are also equal to each other, in which both pairs of coils are arranged symmetrically to a central plane (E) perpendicular to the common axis (a). The axial distance ($g_1$) between the outer field coils (1a and 1b) is 40 to 60% of their inside diameter ($da_2$). The axial distance ($g_2$) between the inner field coils (2a and 2b) is, with a maximum deviation of 15%, equal to that ($g_1$) between the outer coils (1a and 1b). The magnet system forms an almost eight-order coil system and there is at least one transverse access aperture running across the direction of the uniform magnetic field and between the inner field coils (2a, 2b). The magnet system is small by comparison with the examination chamber and relatively light.

15 Claims, 2 Drawing Sheets

MAGNET SYSTEM

BACKGROUND

The invention concerns a magnet system for the production of a static homogeneous magnetic field in an investigation volume of a nuclear spin tomograph (magnetic resonance imaging system) as well as a nuclear spin tomograph with such a magnet system. This type of magnet system is known in the art from US-A-4 701 736.

Nuclear spin tomographs, with their functional performance and imaging procedure capabilities, are described thoroughly in the technical literature (by way of example "Medizinische Physik 1983", He/uml/ thig-Verlag, J. Sche/uml/ tz editor). One of the fundamental components is a magnet system which produces a static, very homogeneous magnetic field in an investigational volume which is as large and as easily accessible as possible. Further requirements are insensitivity to interference from external fields, a small stray field, the avoidance of eddy currents in the event of switching magnetic gradient fields, and last but not least simple and economical production and maintenance as well as low operation costs (electrical current, cooling water etc.).

Since the development of the first tomography systems in the 1970's an entire series of various magnet types have been proposed and to a large extent realized. Naturally, they distinguish themselves from one another to the extent in which they fulfill these specific requirements. Of the three main types of magnets, namely, permanent magnets, resistive electromagnets, and superconducting electromagnets, only resistive and superconducting systems will be considered below since permanent magnets are too heavy and too unstable at the field strength required or desired for many applications. The large majority of the magnet systems utilized today and essentially all superconducting versions consist of a lengthwise extended, largely cylindrical pipe shaped coil, which defines a circular cylindrically shaped inner region (by way of example DE 31 23 493, DE 32 45 945.9). This coil can consist of a plurality of partial sections (by way of example the so-called double Helmholtz configuration, DE 32 45 944.0, EP-A-O 011 335, EP-A-O 033 703 or Nachr. Chem. Tech. Lab. 28 (1980) Nr. 12 Pages 861–865). Although in open air coils of the double Helmholtz type, a sidewards access is in principle possible, the two inner coils of the four coil configuration are so close to one another that it is more practical when the field and patient axis coincide and when access is solely along the solenoid axis. For magnets with cylindrical cryostats and/or iron shielding, this is necessary. In tomographs for whole-body examinations of humans, the free access typically exhibits a diameter of approximately one meter with an entire system length of significantly more than two meters. Thereby, in the most common systems, the patient is located within a long relatively narrow pipe which easily leads to claustrophobia. In addition patient observation by the doctor or patient access for further medical procedures is difficult. The situation is similar for magnet systems of the "window-frame type" (DE 34 18 812.6). In this case, there is the additional problem of the large iron mass which is also associated with the so-called H-magnet (DE 36 16 078.4). With these iron yoke containing pole piece magnets, the free access is significantly better than in the solenoid versions, however there are disadvantages associated with the large weight and with eddy currents induced in the iron of the pole piece and/or the poorly controllable magnetic after-effects in the event of switched gradient fields. An advantage is that the patient axis is perpendicular to the field axis (as is also the case for "window-frames") and, therefore, solenoid coils can be utilized as high frequency senders and for detector coils which, in turn, are significantly more sensitive than saddle coils. For the production of the magnetic field, extremely short air coils (EP-A-160 350) or configurations with which the homogeneity and thereby the investigational region actually lies outside of the magnet structure (DE-A1-31 40 225) are also known in the art. Up to this point however, these have not been made technically feasible and, in practice, have also failed to achieve the specifications required in nuclear magnetic resonance tomography.

The object of the invention is therefore to effect a magnet system for use in NMR tomography with, relative to the size of the investigational volume in which a largely homogeneous magnetic field must be produced, small axial and radial dimensions as well as relatively small overall weight, which allows for possible access to the investigational volume from many differing directions and, moreover, is largely insensitive to eddy current effects which, by way of example, are associated with gradient switching.

SUMMARY OF THE INVENTION

This object is achieved in accordance with the invention by means of the characterizing features of patent claim 1. Accordingly, two pairs of field coils, each pair being made from identical coils, are utilized for the magnet system which are arranged symmetrically with respect to a middle plane running perpendicular to the field axis through the center of the configuration and which exhibit on both sides of this middle plane, a radially outer and a radially inner coil coaxial to the radially outer coil. Both these coils are largely coplanar, that is to say for coils of finite length, there are windings in both coils which exhibit the same axial displacement from the center. The inner and the outer coils are so connected that current runs in opposite directions through them. However, the smallest axial displacement from the center can be chosen to be significantly larger than that of the double Helmholtz configuration known in the art (Garrett, J. App. Phys. 38, 1967, no. 6, Page 2563 and J. Appl. Phys. 22, 1951, No. 9, Page 1091). In this manner both axial access as well as, in the middle plane, radial (that is transverse) access are possible.

Through appropriate choice of the coil separation and dimensions it is possible to achieve a coil system of 8th order, that is to say, all derivatives of the magnetic field with respect to spatial coordinates up to and including 7th order vanish at the center. The double Helmholtz configuration effects such an 8th order system.

The invention is, however, not limited to a coil system of exactly 8th order. Rather, it is possible to separate the coil system coils somewhat further from another than is necessary to achieve 8th order and, thereby, to deform the shape of the homogeneity volume away from the spherical, whereby, a certain amount of residual ripple is accepted so that, in the homogeneity volume thereby resulting, the homogeneity volume limits exhibit a deviation of, by way of example, 20 ppm not only in a single direction (by way of example not only minus 20 ppm) rather in both directions that is to say 20 ppm. This type of system, which achieves largely 8th order and is therefore described here as a system of effective 8th order, is also within the purview of the invention. Clearly a system of 12th order is also within the purview of the invention since the system of 12th order is simultaneously a system of 8th order. Due to the oppositely running currents, for a given total winding length, the field strength achievable at the center is not as high as in conventional systems of 8th order (solenoid type). This, however, is acceptable especially in the case of superconducting magnets, in particular when one takes into consideration the increased high frequency (HF) sensitivity. The advantage of greatly improved access with equivalent homogeneity outweighs the disadvantage of reduced field strength.

The system in accordance with the invention can be resistive as well as superconducting. In the superconducting case the coils are located within a cryostat which has at least two perpendicular adjacent room temperature access openings to the field center and thereby to the investigational volume. These can be axial and/or radial. In the simplest case the cryostat is penetrated by axial and radial room temperature bores which intersect at the center. A total of three bores (one axial, two radial) are also possible and it is not necessary for one bore to penetrate all the way through. Cryostats with at least one transverse room temperature access opening are technically more difficult to realize, but are fundamentally known in the art.

In order to avoid problems associated with safe containment of the magnetic forces among the coil parts, it is advantageous to utilize only one continuous coil support (stainless steel or aluminum) within one cryostat, although the structure, with its large axial separation, permits the utilization of two separate cryostat systems.

The features of the characterizing part of claim 1 notwithstanding, an invention is also envisioned when the homogeneity region has, with fluctuations of at most ±20 ppm, a diameter of at least 40% of the corresponding smaller axial separation $g_2$ or $g_1$ of the radially inner or outer coil pair. It can be particularly advantageous to increase this homogeneity region to at least 50% of this dimension.

BRIEF DESCRIPTION OF THE DRAWINGS

Further details and characterizing features of the invention can be derived from the following description of preferred embodiments utilizing the drawing. Shown are.

Figure 1:
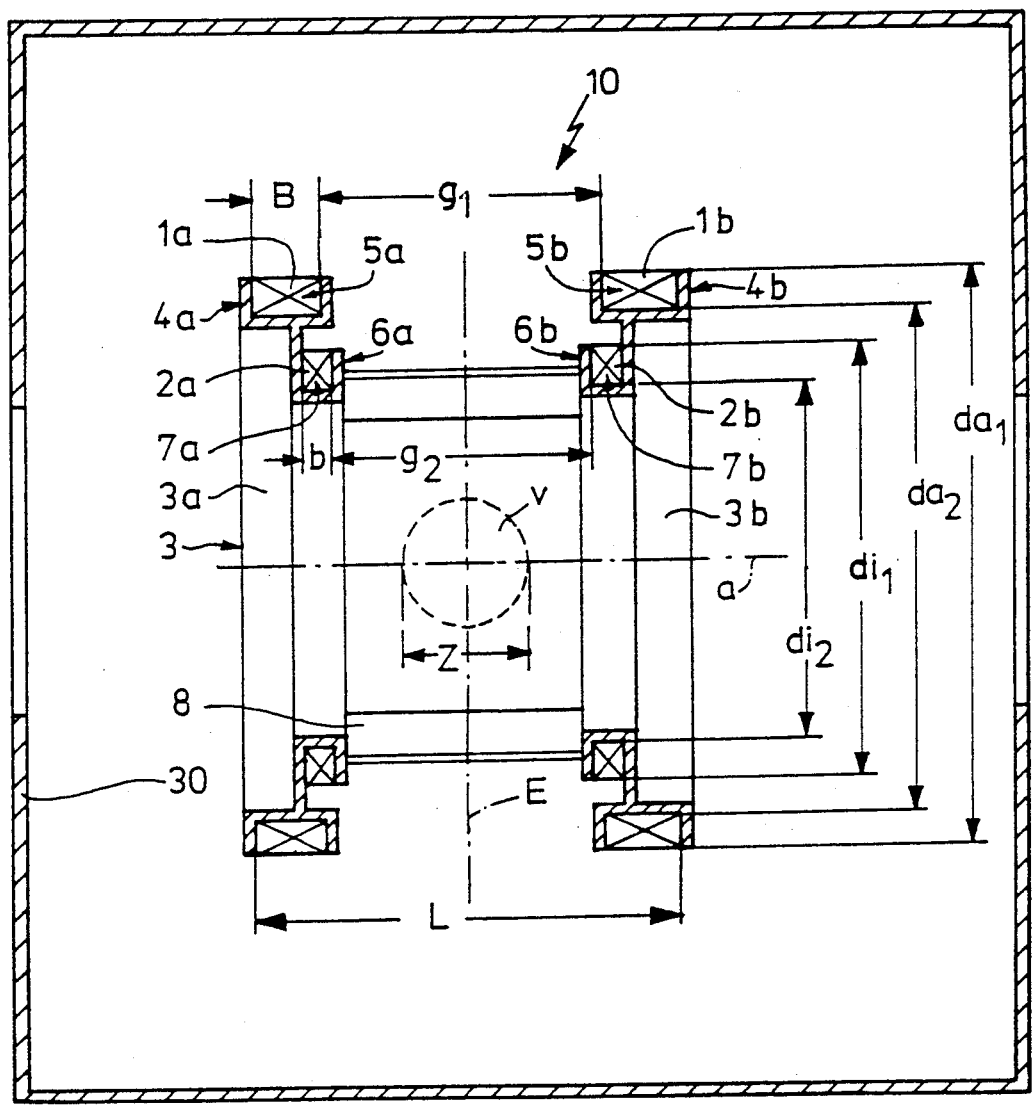
FIG. 1 a magnet system in accordance with the invention in a simplified schematic sectional view in a radial plane containing the central lengthwise axis of the magnet system, FIG. 2a a perspective view of a cryostat for a superconducting magnet system in accordance with FIG. 1 with a horizontally running central lengthwise axis, FIG. 2b The cryostat according to FIG. 1 sectioned along the vertical lengthwise middle plane of the cryostat according to FIG. 2a, FIG. 3a a cryostat for a superconducting magnet system according to FIG. 1 however with the central lengthwise axis running vertically, FIG. 3b a cryostat according to FIG. 3a in sectional view along a plane containing its central axis which runs at right angles to a transverse access opening.

In explicit reference to its details, the magnet system 10 in accordance with the invention represented in FIG. 1 includes a radially outer pair of windings or field coils 1a and 1b as well as a radially inner pair of windings or field coils 2a and 2b which, in their entirety, are arranged coaxially to a common central axis a, and symmetrically with respect to a central cross sectional middle plane E running at right angles to said central axis a. The outer windings 1a and 1b as well as the inner windings 2a and 2b are wound upon a coil body, labeled in its entirety with 3, which, in turn, includes two support rings 3a and 3b supporting the outer and inner windings 1a and 2a or 1b and 2b which are each respectively arranged on one side of the cross sectional middle plane E. These support rings 3a and 3b of the coil body 3 each have in accordance with the representation of FIG. 1 an outer open U profile 4a or 4b defined by mutually adjacent right angle forming sides through which, within the axially directed measured clearance width B and the radially directed measured depth $(d_{a1} - d_{a2})/2$, the rectangular cross sectional area of the winding chambers 5a or 5b is defined, said area being occupied by the windings of the outer field coil 1a or 1b respectively in their densest possible packing, whereby $d_{a1}$ labels the outer diameter and $d_{a2}$ the inner diameter of the outer winding 1a or 1b respectively.

DETAILED DESCRIPTION

Furthermore, the support rings 3a and 3b each have in accordance with the representation of FIG. 1 an inner likewise outer open U profile 6a or 6b defined through right angled mutually adjacent forming sides through which the likewise rectangular cross sectional area of the winding chambers 7a or 7b respectively of axial clearance width b and radial depth $(d_{i1} - d_{i2})/2$ is determined, said area being occupied by the inner field coils 2a or 2b respectively of the winding in the densest possible packing, whereby $d_{i1}$ labels the outer diameter and $d_{i2}$ the inner diameter of the inner windings 2a or 2b respectively. The support rings 3a and 3b of the two partial coil pairs are, for practical reasons, composed of separate partial rings $3a_1$ and $3a_2$ or $3b_1$ and $3b_2$ respectively each for the acceptance of a winding 1a and 2a or 1b and 2b respectively. After the winding is wound the partial rings are structurally connected to each support ring 3a or 3b respectively and rigidly bound to another. The support rings 3a and 3b constructed in this manner are, for their part, rigidly connected to another by means of lengthwise struts 8 whereby, which is not specifically represented, the axial separation of the support rings 3a and 3b is adjustable. In the preferred embodiment shown, the coil body 3 includes four such lengthwise struts which are configured symmetrically with respect to the lengthwise middle plane marked in the plane of the drawing containing the central axis a of the magnetic system 10, and thereby, viewed from the perpendicular axis, can be grouped at equal angular intervals—axially symmetrically—about the axis a. By means of the struts 8, the axial forces which are mutually exercised by the windings 1a and 1b as well as 2a and 2b upon each other when current is flowing through the magnet system are constrained. The axial separation from another $g_1$ at which the outer windings 1a and 1b are arranged can be varied to be between 40% and 60% of the inner coil diameter $d_{a2}$ of the outer field coils 1a or 1b respectively in the magnet system 10, whereby a preferred value for this separation $g_1$ is approximately half of this inner coil diameter $d_{a2}$. The cross section centers of gravity of the windings 1a and 1b (axial $(g_1+B)/2$, radial $(d_{a1}+d_{a2})/2$) are further apart axially than for a Helmholtz arrangement of this coil pair.

The inner coil pair 2a, 2b is, including its characteristic dimensioning—outer diameter $d_{i1}$ and inner diameter $d_{i2}$—smaller than the outer coil pair 1a, 1b, whereby its winding density is equal in magnitude to that exhibited by the outer coil pair. The winding density can differ if necessary.

The axial separation $g_2$ of the inner windings 2a and 2b is, with a deviation of at most 15%, equal to the axial separation $g_1$ of the outer windings 1a and 1b and, in the special embodiment shown, slightly smaller than the axial separation $g_1$ of the outer windings 1a and 1b so that the axial clearance between the two windings 2a and 2b is similar to that of the two outer windings 1a and 1b.

During operation of the magnet system, the direction of the current flowing through the inner pair of windings 2a, 2b is opposite to that flowing through the outer pair 1a, 1b so that the magnetic fields produced by the two winding pairs 1a, 1b and 2a, 2b are oppositely directed with respect to another, whereby assuming that the same current flows in windings 1a and 1b as in 2a and 2b, the number of windings in the outer winding 1a and 1b stands in a ratio of 4/1 to the number of windings in the inner windings 2a and 2b, whereby this ratio can vary within a margin of ±20%.

By suitably choosing the strength of the current flowing through the two winding pairs 1a, 1b as well as 2a, 2b, a sufficiently homogeneous static magnetic field can be produced within the circularly shaped examination volume V which is indicated in FIG. 1 with dashed lines of labeled diameter Z, whereby this diameter Z assumes a value of approximately 40 cm (field deviation 20 ppm).

In a preferred embodiment of the magnet system 1 with superconducting magnet coils, the axial separation $g_1$ of the outer winding pair 1a, 1b assumes a value of 790 mm and the axial width B of the winding chamber 200 mm. The measured axial extent L of the magnet system 10 between the outer walls of the winding chambers 5a and 5b assumes a value of 1190 mm. The inner diameter $d_{a2}$ of the outer winding chambers 5a and 5b assumes a value of 1612 mm and the outer diameter $d_{a1}$ of the outer windings 1a and 1b 1802 mm. The winding density in the outer winding chambers 5a and 5b assumes a value of 36.80 windings/cm$^2$.

In the inner winding pair 2a, 2b, the axial separation $g_2$ of its winding chambers 7a and 7b assumes a value of 757.6 mm whereby the axial width b of these winding chambers 7a and 7b each assumes a value of 54.5 mm. The inner diameter $d_{i2}$ of the windings 2a and 2b has a value of 1220 mm, whereas the outer diameter $d_{i1}$ of the inner windings 2a and 2b has a value of 1378 mm. The winding density of the inner windings 2a and 2b is opposite and equal to that of the outer windings 1a and 1b and has, accordingly, the value −36.8. With this separation $g_2$ of the winding chambers 7a and 7b of the inner coil pairs 2a and 2b, a usable intermediate space z corresponding to 60 cm is effected.

With a current strength of 157A a homogeneous magnetic field in the center of the magnet system 10 of 0.7 Tesla results.

With the above mentioned dimensions, the weight of the four windings including the coil supports assumes a value of approximately 2 metric tons. Of this approximately three quarters is due to the superconducting copper windings and one quarter to the coil supports. This weight is relatively small since no large quantity of iron is necessary for the direction of the magnetic field. For the same reason, in the case of switched gradient fields, magnetic after-effects and induced eddy currents are small.

In explicit reference to the details of FIGS. 2a and 2b, a first preferred configuration of a cryostat 9 is delineated which contains a magnet system 10 whose fundamental construction was described in connection with FIG. 1, said system being coolable in cryostat 9 to such an extent that the windings 1a and 1b as well as 2a and 2b achieve a superconducting state, whereby the cryotechnical construction of the cryostat 9 exhibiting tanks for liquid helium and liquid nitrogen, radiation shields, and evacuated chambers, which is, in and of itself, known in the art, is not shown since further explanation with regard to same is unnecessary. Only the room temperature outer jacket of the cryostat 9, labeled in its entirety with 11, is shown.

The cylindrically shaped central opening 12 which penetrates through the cryostat 9 in the direction of its central axis a has a typical usable inner diameter of 100 cm. The outer diameter of the cryostat jacket has a typical value of 200 cm.

For its part, the measured entire length $L_g$ between the circular ring shaped end face plates 13 and 14 of the jacket 11 of the cryostat 9 has a typical value of 150 cm.

In addition to the central axial opening 12, the jacket 11 of the cryostat 9 also has a transverse through opening 15 the central axis of which $a_t$ intersects the central lengthwise axis a of the cryostat 9 or the magnet system 10 respectively at right angles. This transverse opening 15 exhibits a clearance of typically 60 cm measured parallel to the central lengthwise axis a of the cryostat 9 and, perpendicular to said axis, a clearance corresponding to the inner diameter d of the central lengthwise opening 12.

Figure 2A:
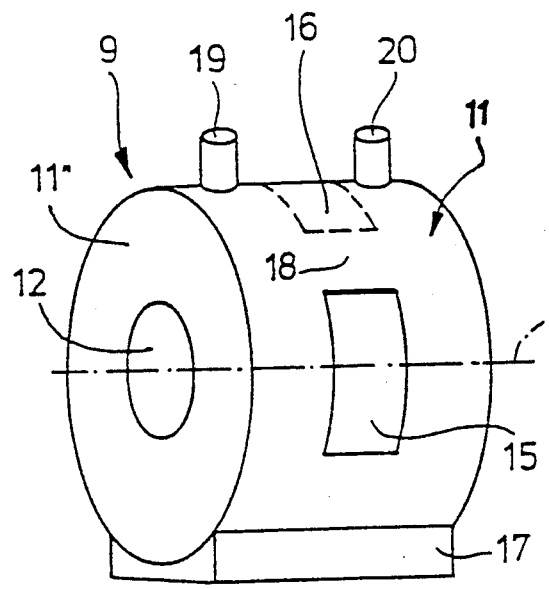
Figure 2B:
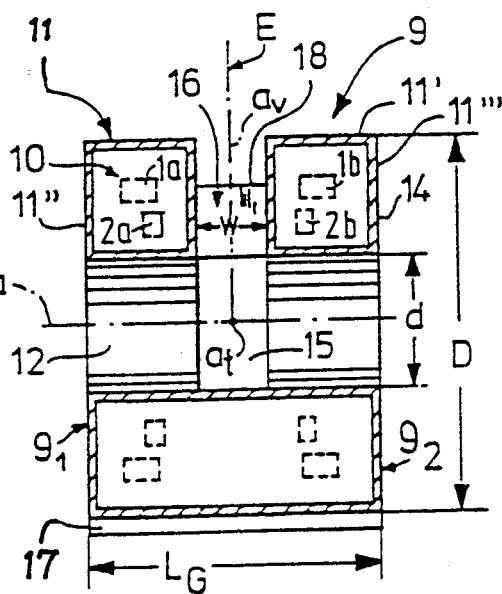

In the embodiment according to FIGS. 2a and 2b the cryostat 9 is arranged in a prone position, that is to say, the plane through the two labeled central lengthwise axes a and $a_t$ of the two openings 12 and 15 is horizontal. The transverse opening 15 is configured symmetrically with respect to the plane through both marked axes a and $a_t$ as well as with respect to the cross sectional middle plane E of the cryostat 9.

The above described cryostat 9 allows a patient who is to be subject to an NMR tomography examination to be brought either into the central axially running opening 12, in which case the magnet system 10 magnetic field is parallel to the lengthwise body axis of the patient, or into the transverse opening 15, in which case the magnetic field is directed transverse to the lengthwise axis of the patient. In both positions the axial extent z of the high field homogeneity region used for the tomography examination, exhibits a value of approximately 40 cm. Shown as dash lines in FIG. 2a and as solid lines in FIG. 2b is a transverse opening 16 which is open at the top, the axial clearance width of which w corresponds to that of the horizontal transverse opening 15 and the transverse clearance perpendicular to the plane of the drawing equals the corresponding diameter of the axial through opening 12. This additional transverse opening 16 whose vertical central axis $a_v$ runs through the point of intersection of the central axes a and $a_t$ of the two other through openings 12 and 15 respectively is, in the special configuration of cryostat 9, so arranged that it feeds into the central axial opening 12 only from above without penetrating through. This opening can however also be configured as a through opening in order, in general, to achieve as symmetric a construction of the cryostat 9 and its jacket 11 as possible. The vertical opening 16 is then closed at its under side by means of the cryostat 9 base 17. The vertical opening 16 can be alternative or in addition to the horizontal openings 12 or 15.

In addition to the advantageous fact that the magnetic field is perpendicular to the lengthwise body axis of the patient, it is particularly advantageous to utilize the transverse opening 15 of the cryostat 9 for introduction of the patient into the examination volume region when surface coils, by way of example receiver coils, are to be placed on the body of the patient from above or from below since, in this configuration, optimum access to the inner organs or to the spine of the patient is effected and the HF field produced by the surface coils is well oriented perpendicular to the static magnetic field direction produced by the magnet system 10.

Figure 3A:
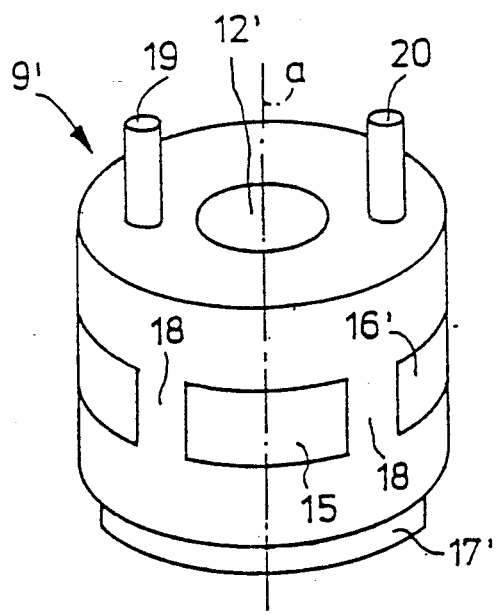
Figure 3B:
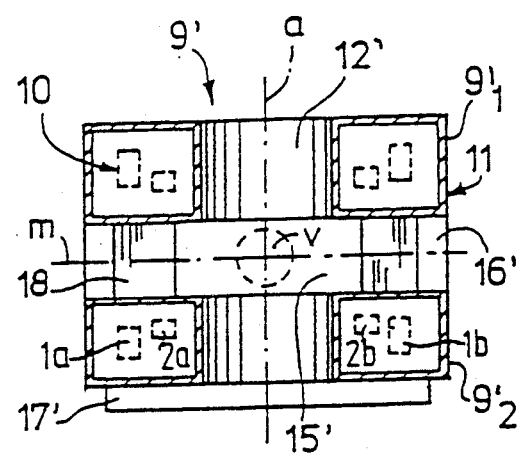

In explicit reference to the details of FIGS. 3a and 3b, the additional configuration of a cryostat 9' containing a magnet system 10 in accordance with the invention, which is intended for full body NMR tomography, distinguishes itself from those depicted in regards to FIGS. 2a and 2b largely only in that the cryostat 9' is arranged in a standing position, that is to say, with a vertically directed central axis a to which the magnetic field in the investigation volume is parallel.

In the embodiment according to FIGS. 3a and 3b, an optimal accessibility to the investigational volume region is effected in that, in addition to the vertically directed and extended axial opening 12', two through transverse openings 15' and 16' are provided, the central axes of which intersect at the center of the investigational volume at right angles. The investigational volume V schematically indicated in FIG. 3b by means of a dotted drawn circle is thereby accessible from above as well as from the sides via four transverse openings, the common middle plane m of which runs horizontally. The vertical central opening 12' is configured here as one which extends through the entire height of the cryostat jacket 11 and which is closed at the under side via base plate 17' which, at the same time, serves as the support base of the cryostat 9'. Alternatively, in the embodiments according to FIGS. 3a and 3b, it is also possible to arrange the vertical access opening 12' in such a manner that it feeds into the transverse opening or openings 15' and/or 16' only from above. The entire configuration formed in such a manner can be effected from two horizontally arranged largely slice shaped cryostats 9'₁ and 9'₂ which are connected to each other by means of a total of four columns or strut shaped-elements—18 of the cryostat 9'. The two slice-shaped cryostats 9'₁ and 9'₂ form, however, from a cryotechnical point of view, a single unit, whereby the communicating connection of the evacuated region and the cryogenic fluid containing chamber—not shown in detail—are joined with another in a communicating manner via the strut-shaped connecting elements. The two partial coil pairs 1a and 1b as well as 2a and 2b are also rigidly connected to another by means of the strut-shaped elements 18. The construction form delineated by means of FIG. 3a and 3b is advantageous when the clearance of the perpendicular opening 12' should be larger than the clearance height of the horizontal opening 15' and 16'.

In a corresponding fashion the horizontally dispositioned cryostat in accordance with the FIGS. 2a and 2b can be effected by connecting two vertical slice shaped cryostats 9₁ and 9₂ to another which, cryotechnically, likewise, by means of—here horizontal—strut elements 18, constitute a cryotechnical unit and are connected to another so that for differing cryogenic fluids—fluid helium, fluid nitrogen—only one filling column 19 or 20 each must be provided for.

In further preferred configurations, an iron shielding 30 is provided for the return of the magnetic flux, which, in turn, largely cylindrically surrounds the magnet system 10. The form taken by this iron shielding 30, can correspond to the radial outer skin 11' of the cryostat jacket 11 including the outer ring face plates 11" and 11''', whereby, in order to facilitate the transverse access, this shielding is also correspondingly interrupted at the available access openings or, similar to the description of EP-AO 141 146, consists of largely four or more strut like shielding elements running parallel to the central axis a which leave the transverse access openings free.

Clearly, measures and modifications known in the art to which no reference has been made, such as adjustability, taking the iron into consideration when calculating the field and the coil configuration, mechanical support, lamination of the iron pieces, utilization of iron pieces to homogenize the field, and so on, can likewise be incorporated here. These measures are also possible in resistive as well as in superconducting systems.

The shim coils and/or gradient system for solenoid-like full body tomographs which, in and of themselves are known in the art, can be advantageously changed in such a manner that, at the position of the transverse access, an opening of at least approximately 60 cm remains. This is entirely possible since the correction and/or gradient coils must not be limited to a fixed radius.

One obtains one or two fully free mutually perpendicular transverse openings when one utilizes shim or gradient plate configurations which, in turn, have been known for some time in the art of pole piece magnets, however, in general, with the cost of a reduction in axial accessibility.

Access openings perpendicular to the lengthwise body axis of a patient can, in medical full body tomographs, be advantageously used for communication with or observation of the patient and/or for introducing additional therapeutic, monitoring, and diagnostic devices.

With the invention, a plurality of possibilities result for better accessibility to the investigational volume which improve optimal utilization of tomography for body investigations. Furthermore, according to the invention, the interaction between the static magnetic field and the switched gradient fields is reduced.

In order to, if necessary, further increase the homogeneity, it is possible to provide for even more coils, whereby a coil system of a still higher order can be effected.

We claim:

1. Magnet system for the production of a static homogeneous magnetic field in an investigational volume of a nuclear spin tomograph, said magnet system comprising:
   a pair of mutually similar outer field coil means, disposed along a common axis at an axial separation with respect to each other, for producing a magnetic field in one direction;

a pair of inner mutually similar field coil means, disposed coaxial with the outer field coil means at an axial separation therewith and arranged symmetrically to a central middle plane running perpendicularly to the common axis, for producing a magnetic field in a direction opposite said one direction and an 8th order homogeneous magnetic field between the inner field coil means;

said axial separation of the outer field coil means being between 40% to 60% of an inner diameter of the outer field coil means, the axial separation of the inner field coil means being equal, within a derivation of at most 15% of the axial separation of the outer field coil means; and means defining at least one transverse access opening extending at right angles to a direction of the homogeneous magnetic field between the inner field coil means.

2. Magnet system according to claim 1 further comprising means defining an axial access opening along the direction of the homogeneous magnetic field.

3. Magnet system according to claim 1 further comprising surrounding iron shielding means for the return of magnetic flux outside of the outer and inner field coil means means having a surrounding pipe shaped jacket body, the jacket body having at least one opening with a longitudinal clearance, parallel to the central axis, and an azimuthal clearance, at right angles thereto, determined by dimensioning of the transverse access opening of the magnetic system.

4. Magnet system according to claim 3 wherein the iron shielding parallel to the central axis of the outer and inner field coils includes extended strut-shaped shielding elements having a circumferencial separation determined by opening sizes of the transverse access openings.

5. Magnet system according to claim 4 wherein the iron shielding means includes at least four strut shaped shielding elements.

6. Magnet system according to claim 4 wherein the strut shaped shielding elements are arranged in an axially symmetric fashion with respect to the central axis.

7. Magnet system according to claim 3 wherein the iron shielding means includes a ring shaped annular end face plate.

8. Magnet system according to claim 3 wherein the iron shielding means includes a closed end plate.

9. Magnet system according to claim 1, further comprising shim and gradient means for the production of magnetic correction and gradient fields in there orthogonal spatial directions and a transverse access opening feeding into the investigational volume is at least 45 cm, measured in a field length direction.

10. Magnet system according to claim 9 wherein the magnetic field in the investigational volume is directed at right angles to a lengthwise body axis of a patient.

11. Magnet system according to claim 9 wherein the magnetic field in the investigational volume is directed parallel to a lengthwise body axis of a patient.

12. Magnet system according to claim 9 further comprising means defining at least one entrance opening running transverse to a body axis of a patient, said entrance being sized for enabling the monitoring, diagnosing, providing therapy to the patient and for communication with he patient.

13. Magnet system according to claim 10, wherein the magnetic field produced by the magnet system is directed horizontally.

14. Magnet system according to claim 1 wherein the outer and inner field coil means are configured for producing a homogeneous magnetic field having a homogensity region with a diameter of at least 40% of the smaller of the axial separation of the inner and outer field coil means respectively.

15. Magnet system according to claim 14, wherein the homogeneity region has a diameter of at least 50% of the smaller of the axial separation of the inner or outer coil means respectively.

* * * * *